United States Patent Office 3,553,142
Patented Jan. 5, 1971

3,553,142

AZEOTROPE AND SOLVENT COMPOSITIONS BASED ON 1,1,2-TRICHLORO-1,2,2-TRIFLUOROETHANE AND ACETONITRILE

Francis J. Figiel, Boonton, and Raymond A. Nesbitt, Morristown, N.J., assignors to Allied Chemical Corporation, New York, N.Y., a corporation of New York No Drawing. Filed Dec. 23, 1968, Ser. No. 786,478
Int. Cl. C11d *7/50, 7/30;* C23g *5/02*
U.S. Cl. 252—141 4 Claims

ABSTRACT OF THE DISCLOSURE

Certain mixtures of 1,1,2-trichloro-1,2,2-trifluoroethane and acetonitrile are useful as solvents to remove rosin fluxes from printed circuit boards. These mixtures are useful because of their unusually high solvency characteristics. A narrower class of such mixtures is particularly valuable because, in addition to high solvency characteristics, the mixtures exhibit essentially the constant boiling characteristics of a binary azeotrope which is formed between these components, thereby facilitating handling and purification of the solvent mixtures without significantly altering their compositions.

BACKGROUND OF THE INVENTION

The electronic industry has sought for solvents which can efficiently remove rosin fluxes from printed circuit boards containing the same. The rosin fluxes are intentionally deposited on the surface of the circuit boards prior to solering on electronic components, but must be removed after soldering in order to achieve maximum reliability of the printed circuits. The solvent must not only be highly effective for removing the undesired rosin flux but must, for commercial applications, be stable, non-flammable and must be inert toward the electronic components on the circuit board itself.

A variety of solvents have been tested for such purposes but generally have been found to be lacking, to a greater or lesser extent, one or more of the above described properties. For example, whereas highly chlorinated solvents, such as $CH_2Cl_2$ and $CHCl_3$, are highly effective for the removal of rosin flux; such solvents, when used alone, attack the electronic components on the circuit board. Such solvents also require the addition of a stabilizer to prevent decomposition. 1,1,2-trichloro-1,2,2-trifluoroethane is an example of a common solvent which is nonflammable and very stable and which accordingly does not cause any decomposition problems during use. Unfortunately, this reagent exhibits only limited solvency for rosin fluxes usually used on electronic assemblies. A variety of nonconstant boiling solvent mixtures have been employed to achieve the desired solvency, while retaining the desired inertness toward the electronic components. Such previously known mixtures are not generally known to possess as high a degree of solvency toward rosin fluxes as might be desired. Moreover, preferential evaporation of the more volatile component of such mixtures results in mixtures with changed compositions which may have less desirable properties, such as lower solvency for rosin fluxes, less inertness toward the electrical components and increased flammability.

A number of binary azeotropic (constant boiling) mixtures have been employed for the purpose of cleaning electrical circuits, which afford many of the advantages obtainable with solvent mixtures, but which do not suffer from the above described disadvantages possessed by nonconstant boiling solvent mixtures. Illustrative of such binary azeotropic systems are the azeotrope of 1,1,2-trichloro-1,2,2-trifluoroethane and methylene chloride, B.P. 37° C./760 mm. (U.S. Pat. 2,999,817) and the azeotrope of 1,1,2-trichloro-1,2,2-trifluoroethane and methyl alcohol, B.P. 39° C./760 mm. (U.S. Pat. 2,999,816). Unfortunately, the solvencies of these binary azeotropic compositions for the common rosin fluxes which are employed in the manufacture of printed circuit boards are such that the solvents either attack the boards or components, leave deposits on the boards or become cloudy after use. It is a major object of this invention to provide novel solvent compositions for rosin fluxes normally encountered on printed circuit boards which novel solvent compositions exhibit a high degree of solvency for such rosin fluxes.

It is another object of this invention to provide novel solvent compositions for rosin fluxes of printed circuit boards which are constant boiling or essentially constant boiling. Another object of the invention is to provide novel solvent compositions for rosin fluxes used on printed circuit boards which combine the properties of high solvency, non-flammability and inertness to electronic components.

It is a particular object of the invention to provide novel solvent mixtures possessing the non-flammability and stability characteristics of 1,1,2-trichloro - 1,2,2 - trifluoroethane but which exhibit significantly greater solvency properties toward rosin fluxes which are normally found on printed circuit boards.

Other objects and advantages of the invention will be apparent from the following description.

SUMMARY OF THE INVENTION

In accordance with the invention, it has been discovered that mixtures consisting essentially of 1,1,2-trichloro-1,2,2-trifluoroethane ($CCl_2FCClF_2$) and acetonitrile $$(CH_3CN)$$

in which the weight percent of 1,1,2-trichloro-1,2,2-trifluoroethane is the range of about 62–98 exhibit unexpectedly high solvency for rosin fluxes commonly used on printed circuit boards. Compositions within this weight percent range will dissolve some contaminants which are not soluble in either 1,1,2-trichloro-1,2,2-trifluoroethane or acetonitrile alone. Moreover, compositions within this weight percent range will remain clear even after repeated use to dissolve rosin fluxes whereas when either 1,1,2-trichloro-1,2,2-trifluoroethane or acetonitrile are used alone, precipitation of the rosin fluxes in the solvents takes place quickly causing such solvents to become cloudy. Continued use of the solvents in such a state results in redeposition of rosin fluxes on the circuit boards after removal of the solvents. Further, compositions within the 62–98 weight percent range are non-flammable and are inert to electrical components used on printed circuit boards.

It has been further found that a binary azeotropic mixture is formed at approximately 95 weight percent 1,1,2-trichloro-1,2,2 - trifluoroethane and 5 weight percent acetonitrile (B.P. 44.1° C./760 mm.) and that this mixture as well as certain equivalent mixtures in which the weight percent of 1,1,2-trichloro-1,2,2-trifluoroethane lies between about 80–97 weight percent, are constant boiling or essentially constant boiling. Such mixtures accordingly exhibit little or no change in composition on partial or complete evaporation such as would occur in normal handling or in usual reclamation procedures.

A preferred class of compositions within the scope of the invention are those in which the weight percent of the 1,1,2-trichloro-1,2,2-trifluoroethane component lies between about 90–95. Such compositions are closest to the true azeotrope in constant boiling characteristics and are not subject to discernable composition change upon partial or complete evaporation or distillation. Still preferred is the true azeotropic composition composed of about 95 weight percent 1,1,2-trichloro-1,2,2-trifluoroethane.

None of the mixtures within the scope of the invention have any adverse effects upon circuit boards themselves or upon the electronic components affixed thereto.

The 1,1,2-trichloro-1,2,2-trifluoroethane and acetonitrile components of the novel solvent compositions of the invention are both commercially available. Preferably they should be used in sufficiently high purity so as to avoid the introduction of adverse influences upon the solvency properties or constant boiling properties, if any, of the system. A suitable grade of 1,1,2-trichloro-1,2,2-trifluoroethane, for example, is sold by Allied Chemical Corporation under the trade name "Genesolv" D.

The novel binary mixtures of the invention may be purified and reclaimed for use after they have ultimately become saturated by simple flash distillation.

DETAILED DESCRIPTION AND DISCUSSION OF THE PREFERRED EMBODIMENT

Example 1

The true azeotropic mixture of the invention was prepared as follows:

A sample of about 1 mol (41.0 grams) $CH_3CN$, B.P. 82° C., and about 2 mols (375.0 grams) $CCl_2FCClF_2$, B.P. 47.7° C., was refluxed in a 2,000 ml. pot of a 4' (length) x ½" (diameter) laboratory still. The temperature at the still head was 44.1° C./760 mm. This temperature is below the boiling points of either of the mixture components, thereby indicating that a binary azeotrope was formed. A sample of the azeotrope distillate was analyzed by liquid-gas chromatography and the presence of $CH_3CN$ and $CCl_2FCClF_2$ was confirmed. The azeotrope was then redistilled but no change in boiling point or composition was indicated. The exact composition was then determined by calibration of the chromatograms and was found to be:

| | Weight percent |
|---|---|
| $CCl_2FCClF_2$ | 95.1 |
| $CH_3CN$ | 4.9 |

This azeotrope was tested for flammability by the open cup flash point test (ASTM D1310–63) and was classified as non-flammable.

Example 2

This example shows that the novel azeotrope is a stable solvent in the present of water even without the addition of a stabilizing agent.

About 65 grams of the true azeotrope (95.1 weight percent, $CCl_2FCClF_2$/4.9 weight percent $CH_3CN$) were refluxed with about 18 weight percent of water for a period of about 24 hours. At the end of this period, a chloride determination was made on the aqueous layer of the test sample and on the water extract of a blank prepared as described above but without refluxing. In neither sample was there detected any chloride greater than 0.1 p.p.m. $Cl^-$, thereby indicating that the azeotrope was stable in the presence of water.

Example 3

The solvency powers of certain mixtures of $CCl_2FCClF_2$ and $CH_3CN$ were evaluated by determining their Kauri- Butanol values (K-B values) in accordance with ASTM test D1133–54T. The results of the evaluations are noted in the following table:

Table I

| Solvent: | K-B value |
|---|---|
| $CCl_2FCClF_2$ | 32 |
| $CH_3CN$ | 16.9 |
| 95.1 wt. percent $CCl_2FCClF_2$<br>4.9 wt. percent $CH_3CN$ (azeotrope) | 41.6 |
| 98 wt. percent $CCl_2FCClF_2$<br>2 wt. percent $CH_3CN$ | 37.5 |
| 97 wt. percent $CCl_2FCClF_2$<br>3 wt. percent $CH_3CN$ | [1] 38.9 |
| 95 wt. percent $CCl_2FCClF_2$<br>5 wt. percent $CH_3CN$ | 41.5 |
| 90 wt. percent $CCl_2FCClF_2$<br>10 wt. percent $CH_3CN$ | 48.0 |
| 80 wt. percent $CCl_2FCClF_2$<br>20 wt. percent $CH_3CN$ | 48.0 |
| 62 wt. percent $CCl_2FCClF_2$<br>38 wt. percent $CH_3CN$ | [1] 32.5 |
| 50 wt. percent $CCl_2FCClF_2$<br>50 wt. percent $CH_3CN$ | 26.0 |

[1] Determined by interpolation.

The above data show that the K-B values of all the above noted mixtures within the scope of the invention are higher than the K-B value of either of the mixture components alone. This shows that the solvency powers of such mixtures are greater than those of the mixture components alone.

Example 4

The unexpected high solvency power of the novel azeotropic mixture is further shown by the following data:

A number of aluminum squares (2 x 4 cm.) were weighed and then coated with Rosin Flux No. 77–25–TA (a product of London Chemical Company). This is a rosin commonly used in the manufacture of printed circuits and is said to contain as major ingredients some form of pine tree gum, abietic acid and related substances. The coated squares were baked in an oven at 232° C. for 30 seconds and then again at 287° C. for 30 seconds. The baked coated squares were then weighed again to ascertain the weight of the flux deposited on the same. Some of the squares were then completely immersed in a sample of the novel azeotrope (95.1 weight percent $CCl_2FCClF_2$/4.9 weight percent $CH_3CN$). Others of the coated squares were immersed in $CH_3CN$ alone and still others of the coated squares were immersed in $CCl_2FCClF_2$ alone. After 15 seconds immersion in each of the solvents at 21° C., the squares were removed from the solvents. The squares were then weighed to ascertain the weight of the residues of flux still remaining on the same. This permitted calculation of the weight percent flux removed. The results are shown in the following table:

TABLE II

| Solvent | Wt. of flux deposited, grams | Wt. of flux residue, grams | Wt. of flux removed, percent |
|---|---|---|---|
| $CCl_2FCClF_2$ | 0.0125 | 0.0023 | 81.6 |
| | 0.0096 | 0.0037 | 61.8 |
| $CH_3CN$ | 0.0117 | 0.0007 | 94.0 |
| | 0.0112 | 0.0012 | 89.3 |
| $CCl_2FCClF_2$/$CH_3CN$ | 0.0128 | 0.0000 | 100.0 |
| Azeotrope | 0.0102 | 0.0000 | 100.0 |

It was observed during the above-described tests that the $CCl_2FCClF_2$ and $CH_3CN$ solvents when used alone were cloudy and contained flux precipitates at the end of the tests, whereas the azeotrope solution, even though it had dissolved 100% of the flux, was clear. The unexpectedly high solvency power of the novel mixtures manifests itself, when used as a cleaning fluid for printed electronic circuits, by the higher retention of dissolved rosin fluxes in solution, even after repeated usage, thus tending to avert clouding of the solvent solution, precipitation of the rosin out of solution and redeposition of thin films of rosin back onto surfaces from which the fluxes have been removed.

The novel solvent mixtures of the invention find other solvent applications such as for removing gases and oils from a variety of industrial items, for the removal of soldering fluxes, for the cleaning of photographic films and prints, for the removal of buffing compounds such as rouge and also may be used as heat exchange media, electrical transfer media, chemical reaction media and as hydraulic fluids.

It will be apparent to those skilled in the art that for specialized purposes, various additives could be incorporated with the novel solvent mixtures of the invention, for example, lubricants, detergents and the like. These additives are chosen so as not to adversely affect the essential properties of the mixtures for a given application.

The invention is not intended to be limited by any specific embodiments disclosed herein, but only by the scope of the following claims.

We claim:

1. Mixtures consisting essentially of 1,1,2-trichloro-1,2,2-trifluoroethane and acetonitrile in which the weight percent of 1,1,2-trichloro-1,2,2-trifluoroethane is in the range of about 62 to 98.

2. Mixtures according to claim 1 in which the weight percent of 1,1,2-trichloro-1,2,2-trifluoroethane is in the range of about 80 to 97.

3. Mixtures according to claim 1 in which the weight percent of 1,1,2-trichloro-1,2,2-trifluoroethane is in the range of about 90 to 95.

4. A mixture according to claim 1 in which the weight percent of 1,1,2-trichloro-1,2,2-trifluoroethane is about 95.

References Cited

UNITED STATES PATENTS

| | | | |
|---|---|---|---|
| 2,999,817 | 9/1961 | Bower | 252—172 |
| 2,999,815 | 9/1961 | Eiseman | 252—171 |
| 2,774,753 | 12/1956 | Howard | 260—107 |

LEON D. ROSDOL, Primary Examiner

D. L. ALBRECHT, Assistant Examiner

U.S. Cl. X.R.

134—38; 252—67, 153, 162, 172, 364; 260—653